United States Patent [19]

Hsu

[11] 4,317,110
[45] Feb. 23, 1982

[54] MULTI-MODE CIRCUIT

[75] Inventor: Sheng T. Hsu, Lawrenceville, N.J.

[73] Assignee: RCA Corporation, New York, N.Y.

[21] Appl. No.: 164,683

[22] Filed: Jun. 30, 1980

[51] Int. Cl.³ ...................... H03K 11/60; H04Q 3/00
[52] U.S. Cl. ................................. 340/825.91; 307/571
[58] Field of Search ................... 340/166 R; 365/104, 365/540; 307/571

[56] References Cited

U.S. PATENT DOCUMENTS

| B 459,425 | 1/1975 | Oguey | 307/225 C |
|---|---|---|---|
| 3,676,700 | 7/1972 | Buchanan | 307/205 |
| 3,728,556 | 4/1973 | Arnell | 307/251 |
| 3,801,831 | 4/1974 | Dame | 307/251 |
| 3,916,430 | 10/1975 | Heuner | 357/42 |
| 3,942,043 | 3/1976 | Sirocka | 307/279 |
| 4,039,862 | 8/1977 | Dingwall | 307/247 R |

Primary Examiner—Harold I. Pitts
Attorney, Agent, or Firm—Samuel Cohen; Henry I. Schanzer

[57] ABSTRACT

The conduction path of a first transistor means of first conductivity type is connected between a first point of operating potential and an output point. The conduction paths of second and third transistors of second conductivity type are connected in series between the output point and a second point of operating potential. An input signal is applied to the gate electrode of the third transistor while a control voltage is applied to the gate electrodes of the first and second transistors. Different values of control voltage are applied to operate the circuit in different modes. For a control voltage equal to the voltage at the first point the circuit can function to clamp the output to the second point. For a control voltage equal to the voltage at the second point the circuit can function to couple the output to the first point. For a control voltage intermediate the voltage at the first and second points, the circuit functions as a level shift inverter with division of the output voltage across the conduction paths of the second and third transistors.

7 Claims, 7 Drawing Figures

MULTI-MODE CIRCUIT

BACKGROUND OF THE INVENTION

This invention relates to a circuit operable in one mode as a high voltage level shifting inverter and in other modes as a low power clamp to one or the other of two power supply lines.

In some applications it is desirable that a circuit be capable of performing more than one function. This has the advantage of reducing the number of components needed to perform the necessary functions. However, the circuit then has an even greater than usual number of constraints to overcome. For example, a driver circuit for a high density electrically alterable memory array must be able to operate at, and provide, relatively high voltages when information is being written into the array while operating at lower voltages when information is being read out of the memory.

In high density arrays arranged in rows and columns, the driver circuit must be of the type that can be fabricated on "pitch" (i.e. in line) with the rows or columns of the array. Where the driver circuit must operate at high voltages this presents a problem since high voltage devices normally require much space. In addition, where the memory array is of the programmable type, having devices which can be set to different conditions, the driver circuit must be capable of producing the voltages necessary to generate these different conditions.

Accordingly, a circuit embodying the invention is operable in one mode as a high voltage level shift inverter and in other modes as a low power clamp to one or the others of two voltage rails.

SUMMARY OF THE INVENTION

Circuits embodying the invention include a first transistor means of first conductivity type having its conduction path connected between a first point of operating potential and an output point. The conduction paths of second and third transistors of second conductivity type are connected in series between the output point and a second point of operating potential. An input signal is applied to the gate electrode of the third transistor and a control voltage is applied to the gate electrodes of the first and second transistors. Different values of control voltages are applied to operate the circuit in different modes. For one value of control voltage the first transistor is turned off and the second transistor is turned on whereby the circuit can function as a low power clamp to the second point of potential. For a second value of control voltage the second transistor is turned off and the first transistor is turned on whereby the circuit provides a conduction path between the output point and the first point of potential. For values of control voltage intermediate the potential at the first and second points the circuit functions as an inverter, with division of voltage at the output between the second and third transistors.

BRIEF DESCRIPTION OF THE DRAWING

In the accompanying drawing like reference characters denote like components.

DESCRIPTION OF THE PREFERRED EMBODIMENT

Figure 1:
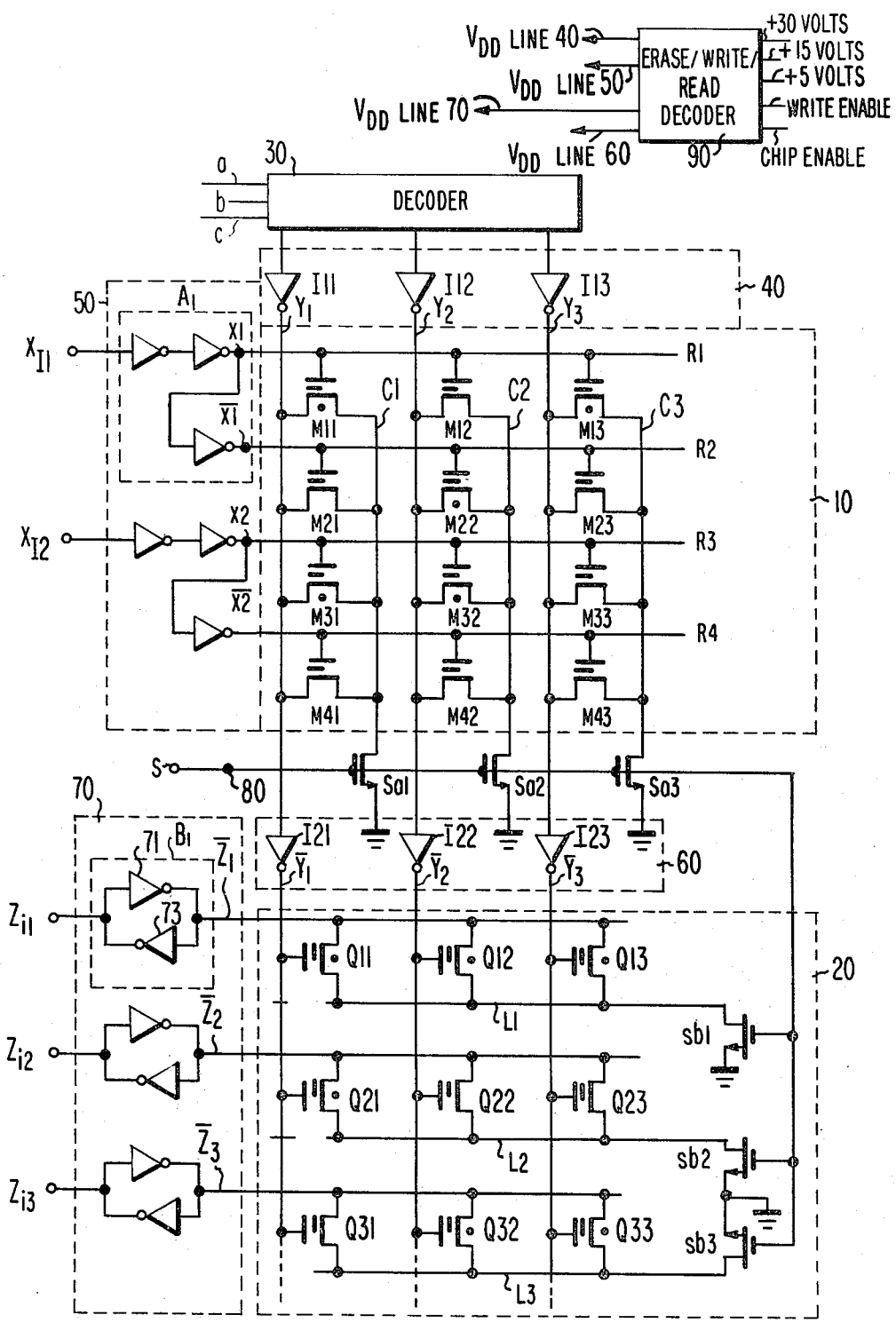
FIG. 1 is a partial schematic, partial block diagram of an electrically Alterable Programmable Logic Array (ALPLA), driven by circuits embodying the invention.

The circuit of FIG. 1 includes an upper matrix array 10 of memory elements, a lower matrix array 20 of memory elements, a decoder 30 responsive to control signals (a, b, c) for generating columnar signals, a column driver circuit 40 responsive to the decoder 30 outputs for level shifting the decoder outputs and driving the column conductors of array 10, an input circuit 50 responsive to input signals $X_{Ii}$ for driving the row conductors of array 10, a column inverter circuit 60 to drive the columns of array 20 to the complementary condition existing on the corresponding columns in array 10, an input/output driver circuit 70 for either driving the row conductors of array 20 or sensing their state; and a decoder circuit 90 responsive to a write enable and a chip enable signal for controlling the value of the operating potentials applied to circuits 40, 50, 60 and 70.

The storage or memory elements used to form arrays 10 and 20 are Gate-Injected Metal-Oxide Semiconductor (GIMOS) field-effect transistors. These devices are known and are described, for example, in my copending application titled ELECTRICALLY PROGRAMMABLE FLOATING GATE READ ONLY MEMORY DEVICE AND METHOD FOR MAKING SAME, filed on Sept. 28, 1978, bearing Ser. No. 946,722, assigned to the assignee of this present application, and the subject matter of which is incorporated herein by reference.

Figure 2A:
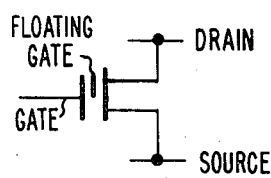
FIGS. 2A, 2B, and 2C, are, respectively the schematic representation of a Gate-Injected Metal-Oxide Semiconductor (GIMOS) transistor which may be used to practice the invention, the current voltage characteristic of the GIMOS transistor for two different values of threshold voltage ($V_{TL}$ and $V_{TH}$) and the schematic representation of a GIMOS transistor set to the low threshold voltage condition.
Figure 2C:
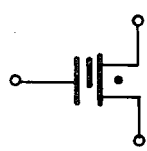
Figure 2B:
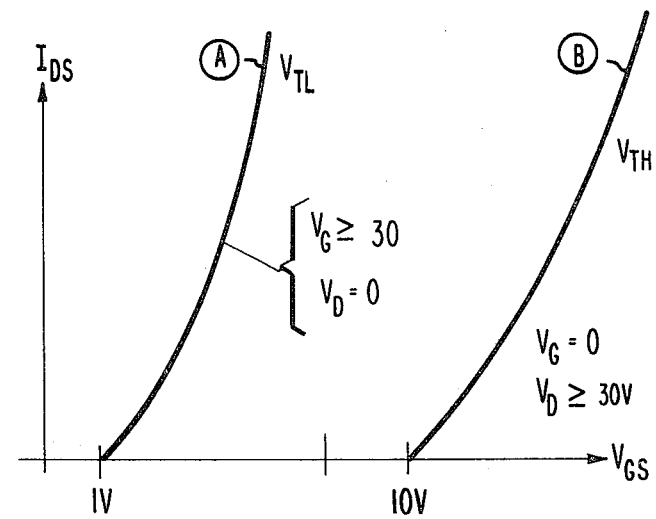

For ease of the description to follow, the symbol for a GIMOS is shown in FIG. 2A. The GIMOS has a floating gate which is offset towards the drain. The GIMOS has a control electrode (control gate) and source and drain electrodes defining the ends of its conduction path within a substrate. The GIMOS transistors used in the circuit of FIG. 1 are of N-conductivity type and the current-voltage ($I_{DS}$ vs. $V_{GS}$) characteristic of the N-type GIMOS for two different values of threshold voltage is shown in FIG. 2B. When a voltage (e.g. +30 volts) is applied to the control gate electrode of the GIMOS which is more positive than the drain voltage (e.g. 0 volts) by some minimum voltage (which in this application is assumed to be 20 volts) holes are injected from the control gate onto the floating gate reducing the gate voltage necessary to turn on the N-channel device. The GIMOS is then set to its low threshold voltage ($V_{TL}$) condition-Curve A in FIG. 2B. $V_{TL}$ is assumed equal to 1 volt at low values of drain-source current. In this application elements set to $V_{TL}$ are identified with a dot as shown in FIG. 2C.

When a voltage (e.g. 0 volts) is applied to the gate electrode of the GIMOS which is more negative than the drain voltage (e.g. 30 volts) by more than some minimum value (which is this application is also assumed to be 20 volts) electrons are injected from the control gate onto the floating gate increasing the gate voltage necessary to turn it on. The GIMOS is then set to its high threshold voltage ($V_{TH}$) condition, shown in Curve B of FIG. 2B. $V_{TH}$ is assumed equal to 10 volts at low values of drain-source current.

A voltage applied between the gate and drain, regardless of polarity, which is less than 20 volts (e.g. 15 volts) will have no effect on the condition of the GIMOS.

The GIMOS is a non-volatile device capable of sustaining tens of thousands of write/erase (W/E) cycles. The digital information stored in a GIMOS can be read out at least $10^{12}$ times without any change in threshold voltage. Therefore, a GIMOS is an ideal device for electrically alterable memory applications such as Electrically Erasable Programmable Read-Only Memory ($E^2$PROM) and electrically Alterable Programmable Logic Arrays (ALPLA). Although GIMOS devices are used in this application, other types of floating gate devices and non-volatile memory elements could be used instead.

Returning to FIG. 1, only 4 rows and 3 columns of elements of array 10 are shown, for ease of description. There is one row conductor (Ri) per row and two column conductors Yj and Cj per column, where i and j are integers representing the row and column numbers, respectively. At each bit location defined as the intersection of a row conductor and two associated column conductors there is a GIMOS device. The source-to-drain paths of the devices of a column are connected between the two column conductors of that column; the gate electrodes of the devices of a row are connected to the row conductor for that row. The GIMOS elements are identified as Mij, with i referring to the order of the row and j to the order of the column.

The odd R(2i-1), and even R(2i) numbered rows and row conductors are paired (i.e. R1 and R2; R3 and R4). The odd numbered row conductors [R(2i-1)] are driven by a signal Xi in phase with an input signal $X_{li}$. The even numbered row conductors (R2i) are driven by a signal $\overline{Xi}$ which is the complement of the signal (Xi) applied to its paired row conductor.

The drains of the GIMOS elements of a column are connected to their corresponding Yj column conductor. Each Yj column conductor is driven by its corresponding level shift inverter driver I1j which is in turn responsive to signals derived from decoder 30.

The sources of the GIMOS elements of a column are connected to their corresponding Cj column conductor. The conduction path of a switching transistor Saj of N conductivity type is connected between each Cj conductor and ground. The gate electrodes of all the Saj transistors which are standard insulated-gate field-effect transistors are connected to a terminal 80 to which is applied a signal S.

Also, for ease of description, only 3 rows and 3 columns of GIMOS elements are shown in array 20. In the lower array 20 there are two row conductors ($\overline{Zi}$ and Li) per row and one column conductor $\overline{Yj}$ per column. The GIMOS elements of array 20 are identified as Qij with i referring to the row and j referring to the column. The gate electrodes of the GIMOS elements of a column are connected to their corresponding column conductor $\overline{Yj}$. Each $\overline{Yj}$ column conductor is connected to the outputs of an I2j inverter whose input is the voltage on its corresponding $\overline{Yj}$ conductor.

The drain electrodes of the Qij elements of a row are connected to a row conductor $\overline{Zi}$. Each $\overline{Zi}$ row conductor is in turn connected to an input-output driver circuit Bi. The source electrodes of the GIMOS elements of a row are connected to a row conductor Li. Each Li conductor is connected to one end of the conduction path of a switching transistor Sbi of N conductivity type, the other end of the path being returned to ground. The gate electrodes of all the Sbi transistors are connected to terminal 80.

The circuit of FIG. 1 also includes ERASE/WRITE/READ decoder 90 which, in response to a Write Enable signal and a Chip Enable signal controls the routing of different operating voltages (e.g. 30 volts, 15 volts, or +5 volts) to the power supply lines of circuits 40, 50, 60 and 70. For example, the decoder making it possible to apply 0 and 30 volts to adjacent row conductors during an erase operation and 0 and 15 volts to the same conductors during a write operation. It also makes possible different levels on the Y and $\overline{Y}$ column conductors; all this will be discussed in greater detail later after FIG. 1 is explained.

The operation of the array will now be discussed following which the structure and operation of the column and row conductor drivers will be detailed.

It will first be shown that the elements of arrays 10 and 20 can be set to desired $V_{TL}$ and $V_{TH}$ conditions. To program the arrays their contents are first erased. "Erasing" is defined herein as writing or setting a GIMOS element to the $V_{TL}$ state. The GIMOS elements of array 10 have to be erased (set to $V_{TL}$) in two steps because its row conductors are driven by complementary signals. In one step one half of the elements of array 10 are set to $V_{TL}$, in the next step the other half of its elements are set to $V_{TL}$.

During the Erase cycle (and later during the Write cycle) a zero volt signal is applied to Pin S thereby turning off all the Saj and Sbi transistors; and the upper column conductors Y1, Y2 and Y3 are driven to zero volts. Concurrently, thirty (+30) volts are applied to one half of the row conductors [e.g. the odd row conductors R[(2i-1)] and 0 volt is applied to the remaining row conductors [e.g. the even row conductors R(2i)].

Thus, GIMOS transistors in the odd rows have +30 volts applied to their gate electrodes and zero volt applied to their drain electrodes. Since these transistors are of N conductivity type and since the gate electrodes are at 30 volts, they are set to their $V_{TL}$ state (they are erased). The unselected transistors (the ones in the even rows) are not disturbed when the selected transistors (the ones in the odd rows) are being erased, since the unselected transistors have zero volts applied to their gate and drain electrodes.

Following the erasing of transistors in the odd rows, the transistors in the even rows are erased (are set to $V_{TL}$). This is accomplished by applying 30 volts to the even rows (e.g. R2i) and 0 volts to the odd rows. Upon the completion of this last step, all transistors in array 10 are in the erased (the $V_{TL}$) state.

Concurrently with the setting of the elements in array 10 to $V_{TL}$, the elements in array 20 are also being set to $V_{TL}$. This is accomplished by driving the column (Y) conductors of array 10 to 0 volts which causes the $\overline{Yj}$ column conductors in array 20 to be driven to +30 volts, while concurrently driving all the row ($\overline{Zi}$) conductors to zero volts. Since the voltage at terminal S is equal to zero, all the Sbi transistors are turned off. Therefore, all the GIMOS transistors in array 20 have +30 volts applied to their gates, 0 volts applied to their drains, whereby all the Qij elements are erased (set to $V_{TL}$). In both arrays 10 and 20 the source electrodes of the GIMOS transistors float; however, in view of the low conduction path impedance, of the devices in the $V_{TL}$ state, there voltage level is at or close to that present at the drain electrodes, namely ground.

Following the ERASE (Write to $V_{TL}$) cycle, a "WRITE" cycle can be initiated during which selected elements of the arrays are set to $V_{TH}$.

The setting of elements in array 10 will first be examined. Zero volts is applied to terminal S to turn off all the Saj and Sbi transistors. During "Write", array 10 is programmed one column at a time. The selected column (e.g. Y1) is driven to +30 volts, while the unselected columns (e.g. Y2, Y3) are set to 0 volt. The row conductors (e.g. R2 and R4) of the elements (e.g. M21 and M41) selected to be set to $V_{TH}$ are driven to 0 volts. The row conductors (e.g. R1 and R3) whose row element are to remain at $V_{TL}$ are driven to +15 volts.

For example, with Y1 at 30 volts and with the $\overline{X1}$ and $\overline{X2}$ conductors driven to 15 volts (while the X1 and X2 conductors are driven to 0 volts), M21 and M41 have 0 volts applied to their gates and +30 volts applied to their drains with their source electrodes floating. M21 and M41 are therefore sufficiently reverse biased (drain to gate) to be set to the $V_{TH}$ condition. Concurrently, M11 and M31 with +30 volts also applied to their drains have +15 volts applied to their gates. Therefore, M11 and M31 only have a stress of +15 volts between their gate and drain which is insufficient to disturb or change their condition. Therefore, M11 and M31 remain in the $V_{TL}$ state. Clearly, the non-selected GIMOS transistor (e.g. M11) of paired elements (e.g. M11 and M21) in a particular column Yj is not disturbed when the other transistor of the pair sharing the same column is set to the $V_{TH}$ condition.

Either one (e.g. M12) of the two elements of paired rows (R1 and R2) sharing a column can be set to $V_{TH}$. Specifically, to set M12 to $V_{TH}$ Y2 is driven to 30 volts, X1 is driven to 0 volts and $\overline{X1}$ is driven to +15 volts. Thus, in column 1 element M11 was held at $V_{TL}$ and M21 was set to $V_{TH}$, while in column 2 element M12 was set to $V_{TH}$, while M22 was held at $V_{TL}$.

The two paired row elements M(2i-1)j and M2i,j of a column can be set to $V_{TH}$. This is illustrated in column 3 where elements M33 and M43 are set to $V_{TH}$. This can be done in two steps as detailed below.

First, Y3 is driven to 30 volts while 0 volts is applied to the other columns (Y1 and Y2) and to the S terminal. X1 is driven to +15 volts, maintaining M13 in its $V_{TL}$ state. $\overline{X1}$ is driven to 0 volts setting M23 to its $V_{TH}$ state. X2 is driven to 0 volts (while $\overline{X2}$ is held at 15 volts) setting M33 to $V_{TH}$ while M43 is maintained in its $V_{TL}$ state. Then X2 is driven to 15 volts while $\overline{X2}$ is held at 0 volts. This sets M43 to $V_{TH}$ while maintaining M33 in the $V_{TH}$ state to which it was just set. The stress of 15 volts between the drain and gate of M33 while M43 is being set to $V_{TH}$, is insufficient to disturb the $V_{TH}$ state to which it was just set. In a similar manner M13 as well as M23 can be set to $V_{TH}$.

Concurrently, with the setting of elements in array 10 to $V_{TH}$, elements in array 20 are also set to $V_{TH}$ one column at a time. The $\overline{Yj}$ conductor of the column whose elements are being written is driven to 0 volts while the $\overline{Yj}$ conductors of the columns not being written are driven to +15 volts. Concurrently, the Zi conductors of the rows whose elements are being written to $V_{TH}$ are driven to +30 volts, while the $\overline{Zi}$ conductors of the rows whose elements are being held at $V_{TL}$ are held at zero volts.

For example, when writing in column 1 of array 10 Y1=30 volts while Y2 and Y3 are at 0 volts. Concurrently, $\overline{Y1}$ is at 0 volts while $\overline{Y2}$ and $\overline{Y3}$ are at +15 volts.

To set Q31 to $V_{TH}$, $\overline{Z3}$ is placed at 30 volts while $\overline{Z1}$ and $\overline{Z2}$ are at 0 volts. The non-selected elements (Q11 and Q21) sharing the same column as Q31 are not disturbed since their gates and drains are at zero volts. The nonselected elements (Q32, Q33) sharing the same row at Q31 are not disturbed since their gates are at +15 volts while their drains are at +30 volts. As noted earlier a reverse (or a forward bias) bias of +15 volts is insufficient to disturb or change the state of the elements of array 10 or 20. The elements which do not share a row or a column with a selected element have +15 volts applied to their gate electrodes and 0 volts applied to their drain electrodes and remain in whatever state to which they were previously set. It should, therefore, be evident that any number of elements of array 20 can be selectively set to $V_{TH}$ without disturbing the non-selected elements.

We shall now discuss the decoding circuit 30, the inverting circuitry 40 and 60, the input circuitry 50, and the input-output circuitry 70 and their operating during the erase, write and read modes of operation.

The decoding circuit 30 can be any one of a number of known low voltage decoders and need be detailed. In response to externally applied signals a, b, c, generated by a signal source such as a microprocessor (not shown) decoder 30 can apply a +5 volts or ground signal to any one of the Ili inverters.

In the manufacture of high density arrays it is important that the decoder and inveter driving each column conductor be placed on "pitch" (i.e. in line) with the column. "Pitch" as used herein refers to the distance between two columns (or rows) of the array. In addition to this constraint, the inverter must be capable of level shifting the 0-5 volt level signals produced by the decoder 30 to signals ranging between 0 and 30 volts to drive the GIMOS elements of the array. In high density integrated circuits, voltages in the 30 volt range are considered relatively high voltages. Normally, the devices and the circuits built to withstand and operate at these voltages have to be made relatively large. These requirements thus present a problem since they tend to prevent the desired high density structure. However, as detailed below, the I1j inverter-drivers include special devices which can withstand higher voltages and two standard transistors connected in series and biased such that the high voltage can be divided across their conduction paths. Thus, no single device has to sustain a very large potential and no single device has to be made very large.

Figure 3A:
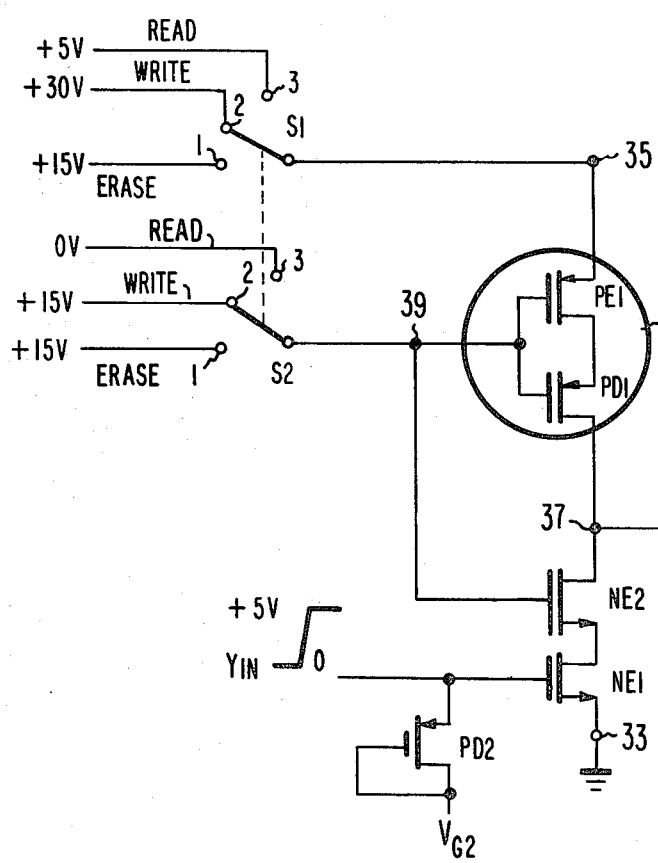
FIG. 3A is a detailed schematic diagram of one of the Y-column level shift inverter drivers in block 40 of FIG. 1 embodying the invention.

The level shifting inverter driver circuits I11, I12, and I13 are of the type shown in FIG. 3A and are designed to enable the fabrication of a relatively high voltage level shift circuit on pitch with the high density array 10.

Figure 3B:
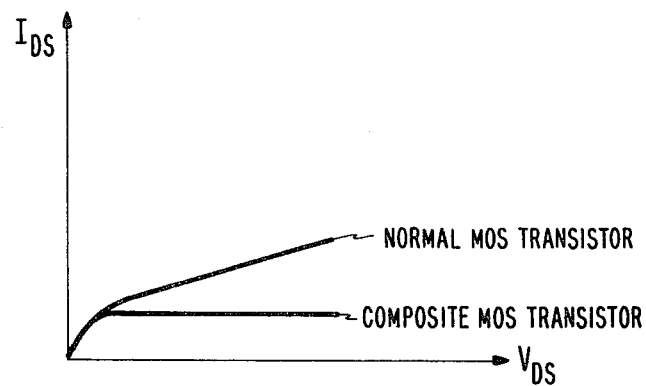
FIG. 3B is a graph of the current voltage characteristics of a composite transistor used in FIG. 3A and of a standard IGFET.

The circuit of FIG. 3A includes a composite P-channel depletion/enhancement (D/E) insulated gate field effect transistor (IGFET) 31. For ease of explanation, transistor 31 is shown as a discrete enhancement transistor, PE1, and a discrete depletion type transistor, PD1, whose conduction paths are connected in series between the positive power supply terminal 35 and an output terminal 37. The characteristics of the composite transistor 31 are compared to those of a typical IGFET in FIG. 3B. The composite transistor 31 due to the combination of the enhancement and depletion feature provides high transconductance (hence high speed of response), relatively high current and a high breakdown voltage (hence enabling high voltage operation).

Two enhancement type N-channel IGFETs NE1 and NE2 have their conduction paths connected in series between output terminal 37 and ground terminal 33.

The gate electrodes of transistors PE1, PD1 and NE2 are connected to a control voltage terminal 39.

The gate electrode of transistor NE1 is connected to a source of input signals $Y_{IN}$ whose amplitude may switch between 0 volts and 5 volts. A P-type depletion IGFET PD2 functioning as a load device is connected between the gate of NE1 and a negative potential point $V_{G2}$ which may be, for example, $-5$ volts to ensure the full turn-off of NE1 under steady state condition. A switch S1 connected to line 35 is used to vary the potential ($V_{DD}$) applied to power supply line 35. A switch S2 connected to terminal 39 is used to vary the potential ($V_C$) applied to that terminal. Switches S1 and S2, shown as single pole triple throw switches for simplicity, are part of the electronic control circuit of decoder 90 which varies the operating potential applied to driver circuits 40, 50, 60, and 70 in response to enabling inputs. However, switches S1 and S2 could instead be part of control circuitry contained within circuit 40.

During the "Erase" cycle switches S1 and S2 are placed in their position 1 to apply $+15$ volts to line 35 and $+15$ volts to terminal 39. During the "write" cycle, switches S1 and S2 are placed in their position 2 to apply $+30$ volts to line 35 and $+15$ volts to terminal 39. During the "Read" cycle, switches S1 and S2 are placed in their position 3 to apply $+5$ volts to line 35 and 0 volts to terminal 39.

The operation of the level shifting inverter driver is now described. During the Erase mode, $+15$ volts is applied to terminals 35 and 36 (i.e. $V_C = V_{DD}$). Transistors PE1 and PD1 are not conducting since PE1 is off (its gate and source are at $+15$ volts) and no current can flow through it into PD1. NE2 has a potential of $+15$ volts applied to its gate which is of a polarity to turn it on hard. Thus, whenever $Y_{IN}$ goes to $+5$ volts, (or at least above the threshold voltage of NE1) NE1 turns on and NE1 and NE2 conduct pulling the potential at terminal 37 to ground ($Y_{OUT}$ goes to zero). Recall that during Erase all the Y columns are driven to zero which is accomplished by causing all $Y_{IN}$'s to go positive. Thus, during the Erase cycle the circuit of FIG. 3A can function as a low power clamp to ground since PE1 and PD1 are turned OFF and appear as an extremely high impedance between the output 37 and line 35. If, during Erase, $Y_{IN}$ is less positive than the threshold of NE1, transistors NE1, NE2 and PE1, PD2 are rendered non-conducting and the output floats.

For the "Write" mode $+30$ volts are applied to terminal 35 and $+15$ volts (i.e. $V_C = V_{DD}/2$) are applied to terminal 39. For this condition the circuit of FIG. 3 functions as a level shifting inverter as detailed below. PE1 with its source at $+30$ volts and its gate at $+15$ volts is turned on and PD1 is likewise biased into conduction. Thus, PE1 and PD1 which are turned-on provide a conduction path between output terminal 37 and the $V_{DD}$ line which is now at $+30$ volts. During "Write" NE2 is also turned on since $V_C = +15$ volts is applied to its gate. The conduction paths of NE2 and NE1 are connected in series between terminal 37 which is at $+30$ volts and terminal 33 which is at ground potential. Therefore, the $+30$ volts at terminal 37 appears across the series conduction path of NE1 and NE2. When NE1 is turned off ($Y_{IN}=0$ volts) there is no current conduction through NE1 and NE2. Since the gate of NE2 is at $+15$ volts, the potential at its source is approximately equal to $+15$ volts [actually it is somewhat less than $+15$ volts due to the $V_T$ of NE2, but for ease of explanation the $V_T$ of NE2 will be ignored.] The potential at the drain of NE1 is equal to the source potential of NE2 which is approximately equal to $+15$ volts ($V_{DD}/2$). Thus, NE2 has $+30$ volts at its drain and $+15$ volts at its source while NE1 has $+15$ volts at its drain and 0 volts at its source. Thus, approximately one-half of the voltage at terminal 37 appears across the source-to-drain path of NE2 and the remainder appears across the source-to-drain path of NE1. Thus, NE1 and NE2 are each stressed by only a fraction of the full operating potential ($V_{DD} = +30$ volts) and need not be made high voltage devices. High voltage devices require substantially more surface area. Thus, the circuit can be integrated into a very small area which is a significant advantage of the circuit.

If $Y_{IN}$ is $+5$ volts NE1 is turned on and conducts pulling the source of NE2 towards ground. NE2 also conducts since it is positively biased and pulls terminal 37 towards ground. The conductivity of NE1 and NE2 is made greater than that of PE1 and PD1, so that $Y_{OUT}$ will be pulled close to ground potential. Thus, during Write, $Y_{OUT}$ can be made to swing between 0 volt and 30 volts in response to a $Y_{IN}$ varying between $+5$ volts and 0 volts. Recall that during "Write" selected Yj columns are driven to $+30$ volts while unselected columns are held at ground. Thus, $Y_{IN}=0$ volts corresponds to a selected column condition and $Y_{IN}=+5$ volts corresponds to a non-selected column condition.

For the "Read" condition, $+5$ volts, which is the amplitude of the low voltage logic level are applied to terminal 35, and 0 volt is applied to terminal 39. Transistor PE1 with $+5$ volts at its source and 0 volt at its gate is turned on and PD1 is also turned on. Transistor NE2 with zero volts applied to its gate is turned off during the whole read cycle. Hence, regardless of the value of $Y_{IN}$ there is a relatively high impedance path between terminal 37 and ground and the combination of PE1 and PD1 then functions as a pull-up resistor connected between $V_{DD}$ and terminal 37. The circuit of FIG. 3 does not dissipate power in this mode since there is no conduction through NE1 and NE2 when PE1/PD1 are turned on.

However, since PE1 and PD1 are always turned on during the Read mode, a condition of continuous power dissipation can exist if the load connected to the output 37 is dissipative. Referring to FIG. 1, a steady state current can flow through PE1/PD1 onto the column conductor and via the conduction path of a selected memory Mij element set to $V_{TL}$ (high conductive state) when the row conductor (gate) of the selected device is high.

This power loss can be significantly reduced by operating the driver and the array in a dynamic mode during Read. This involves the pulsing (not shown) of the common gate terminal 39 of PE1/PD1 and NE2 and sequencing the application of voltages to the array.

First, current conduction through the elements of the array is prevented by turning off the Saj transistor and/or applying 0 volts to the Ri row conductors and setting $Y_{IN}=0$. Then, the voltage at terminal 39 is pulsed to zero volts, [e.g. via a precharge pulse (not shown)]. This turns on PE1/PD1 and precharges the selected column (drain line) of array 10 connected to $Y_{OUT}$ to the $V_{DD}$ potential on line 35. The voltage at terminal 39 is then switched to $V_{DD}$ turning off PE1/PD1. $Y_{OUT}$ remains precharged to $V_{DD}$, but is electrically floating since PE1/PD1 and NE1 are off. A positive going read pulse is then applied to the S terminal turning on the Saj transistors. Depending on the status of the input (Xi) logic levels and the threshold voltages of the memory elements of the selected column the column potential will be pulled down to the low (0 volt) logic level or remain at the high (+5 volts) logic level.

The circuit of FIG. 1 is, thus, suitable to produce either:

1. A good clamp to ground (when switches S1 and S2 are in position 1);
2. A high voltage level shift inverting function (when switches S1 and S2 are in position 2); or
3. A good clamp to the positive power supply (when switches S1 and S2 are in position 3).

In position 2 the potential ($V_C$) applied to terminal 39 is one-half the potential ($V_{DD}$) applied to terminal 35. However, the ratio of $V_C$ to $V_{DD}$ can be any convenient value provided that PE1, PD1, ND1 and NE2 are properly designed to divide the applied voltage.

Figure 4:
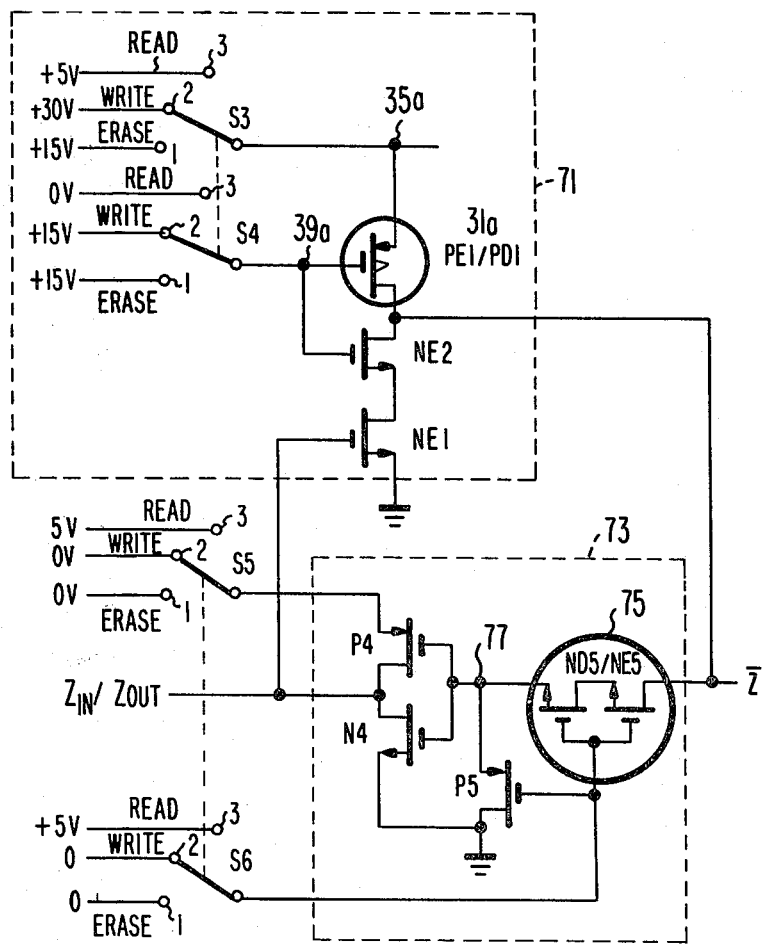
FIG. 4 is a detailed schematic diagram of one of the input-output drivers shown in block 70 of FIG. 1 embodying the invention.

An input-output driver suitable to drive the $\overline{Z}$ row conductors is shown in FIG. 4. The circuit includes a section 71, similar in configuration and operation to the column driver shown in FIG. 3, for driving the $\overline{Zi}$ lines during Erase and Write in response to a signal $Z_{IN}$.

The circuit also includes a section 73 for reading or sensing the array output produced on the Z lines and producing, in turn, an output $Z_{OUT}$ during Read.

The input circuit of section 73 includes a composite transistor 75 comprised of an enhancement N-channel IGFET NE5 and a depletion N-channel IGFET ND5. NE5 and ND5 are designed to withstand the 30 volts applied to the Zi during Write.

The conduction paths of NE5 and ND5 are connected in series between the $\overline{Z}$ conductor and a node 77 to which is connected the gates of transistors P4 and N4 and the source of a transistor P5. The gates of ND5/NE5 and P5 are connected to a switch S6 which is used to control the gate potential as a function of the Erase/Write/Read mode. The source of N4 and the drain of P5 are returned to ground potential. The source of P4 is connected to a switch S5 which is used to control the operating potential applied to the complementary inverter P4–N4 as a function of the Erase/Write/Read cycle. The drains of P4 and N4 are connected to, and drive the $Z_{IN}/Z_{OUT}$ line which line is also connected to the gate of NE1 in Section 71.

During Erase and Write cycles switches S5 and S6 are set to positions 1 and 2, respectively, whereby 0 volts is applied to the gates of ND5–NE5 which are then turned off. P5 is turned on clamping the gates of P4 and N4 to ground. N4 is turned off and P4 with 0 volts at its source is non-conducting. Thus, during Erase and Write section 73 functions as a tri-state output circuit placed in the floating output condition.

During the Erase and Write cycles section 71 functions in a similar manner to the circuit of FIG. 3 and need not be repeated.

During Erase the $\overline{Z}$ line is clamped to ground if $Z_{IN}$ is high (+5 volts) and floats if $Z_{IN}$ is low. During Write the $\overline{Z}$ line is clamped to the +30 volts on line 35a if $Z_{IN}$ is low (0 volts) and is driven towards ground potential if $Z_{IN}$ is high (+5 volts).

During Read +5 volts is applied to the gates of P5 and ND5–NE5. P5 is turned off while ND5–NE5 are turned on. ND5 and NE5 function as a transmission gate coupling the potential on row conductor $\overline{Z}$ to node 77. The signal at node 77 is then inverted by the complementary inverter P4–N4. If $\overline{Z}$ is high (+5 volts) $Z_{OUT}$ will be driven to ground. If, on the other hand, $\overline{Z}$ is low, $Z_{OUT}$ will be driven to +5 volts.

During Read, NE2 in section 71 is turned off, but PE1/PD1 of section 71 function as a load resistor coupled between the +5 volts on line 35a and line $\overline{Z}$. Recall that during Read the Sbi transistors are turned on. For any Qij element set to $V_{TL}$ whose drain is connected to the $\overline{Z}$ line and whose gate is connected to a $\overline{Yj}$ column conductor which is driven positive (+5 volts), the $\overline{Z}$ line will be pulled down towards ground potential, otherwise (if $\overline{Yj}$) is at ground or if Qij is set at $V_{TH}$ the $\overline{Z}$ line will remain clamped to +5 volts via PE1/PD1 of section 71.

The connection between the drains of P4/N4 and the gate of NE1 modifies the operation of the circuit of FIG. 4 when operated in the dynamic mode.

In the dynamic Read mode, as discussed above for FIG. 3, the $\overline{Z}$ line is precharged to $V_{DD}$ (+5 volts) by applying a +5 volts to line 35a and 0 volts to terminal 39a. Since $\overline{Z}$ is at $V_{DD}$ and since ND5–NE5 are turned on, inverter P4–N4 clamps the gate of NE1 to ground turning it off. The precharge pulse is terminated with the application to terminal 39a of a voltage equal to $V_{DD}$ (+5 volts). This causes PE1–PD1 to be turned off and NE2 to be turned on. Since NE1 is off the output $\overline{Z}$ line (to which the drains of Qij elements are connected) is floating although precharged to $V_{DD}$. Now, if a Qij element whose drain is connected to the $\overline{Z}$ line is set to $V_{TL}$ and, further, if a positive (+5 volts) signal is applied to its gate, via a column conductor, then the $\overline{Z}$ line is clamped to ground via the Qij and Sbi transistors.

The low on the Z line is then inverted via P4–N4. P4 is turned on and turns on NE1 which in series with NE2 forms a bistable latch regeneratively clamping the $\overline{Z}$ line to ground (the low logic level).

What is claimed is:

1. A level shift circuit comprising:
    a first transistor means of first conductivity type and second and third transistors of second conductivity type, each one of said transistor and transistor means having a conduction path and a control electrode;
    means connecting the conduction path of said first transistor means between an output terminal and a first point of operating potential;
    means connecting the conduction paths of said second and third transistors between said output terminal and a second point of operating potential;
    means connecting the control electrodes of said first transistor means and said second transistor to a control terminal;
    means for applying an operating potential between said first and second points of operating potential;
    means for selectively applying different values of control potential to said control terminal; and
    means for applying an input signal to the control electrode of said third transistor.

2. The combination as claimed in claim 1 wherein said means for applying an operating potential between said first and second points of operating potential includes means for selectively applying different values of operating potential.

3. The combination as claimed in claim 2 wherein said means for selectively applying different values of operating potential includes means for applying a relatively large potential; and wherein said means for selectively applying different values of control potential includes means for applying, concurrently, with the application of said relatively large potential, a voltage having a value intermediate the voltages at said first and second points of operating potential to the control electrode of said second transistor, whereby a predetermined portion of the output voltage at said output terminal appears across the conduction path of said second transistor and the remainder appears across the conduction path of said third transistor.

4. The combination as claimed in claim 1 wherein said means for selectively applying different values of control potential to said control terminal includes means for applying to the control terminal one of:

(a) a voltage equal in value to that applied to said first point for turning off said first transistor means and turning on said second transistor;

(b) a voltage equal in value to that applied to said second point for turning on said first transistor means and turning off said second transistor; and (c) a voltage intermediate that applied to said first and second points for turning on both of said first transistor means and said second transistor at the same time.

5. The combination as claimed in claim 1 wherein said first transistor means includes an enhancement type insulated-gate field-effect transistor and a depletion type insulated-gate field-effect transistor;

wherein the conduction paths of said enhancement and depletion transistors are connected in series and wherein the gate electrodes of said enhancement and depletion transistors are connected in common.

6. The combination as claimed in claim 1 further including a fourth transistor means and a fifth transistor of said second conductivity type and a sixth transistor of first conductivity type, each one of said transistor means and transistors having a a conduction path and a control electrode;

means connecting the conduction path of said fourth transistor means between said output terminal and the control electrodes of said fifth and sixth transistors;

means connecting the conduction path of said fifth transistor between an input/output (I/O) terminal and a first point of reference potential;

means connecting the conduction path of said sixth transistor between said I/O terminal and a third point of operating potential;

means connecting said I/O terminal to the control electrode of said third transistor;

means for applying a different value of control voltage to the control electrode of said fourth transistor means; and means for applying different values of operating potential to said third point of operating potential.

7. In combination with an array of elements which can be programmed to either one of two conditions by the application of relatively large voltages to the elements and whose programmed conditions can be sensed by the application of relatively small voltages, and where the elements are arranged in rows and columns, and where there is at least one row conductor per row of elements and one column conductor per column of elements, a circuit for applying voltages to a conductor suitable to program or sense an element comprising:

a first relatively high voltage breakdown transistor of one conductivity type, and second and third transistors of second conductivity type, each one of said transistors having a conduction path and a control electrode;

means connecting the conduction path of said first transistor between a first point of operating potential and a conductor;

means connecting the conduction paths of said second and third transistors in series between said conductor and a second point of operating potential;

means selectively applying an operating potential across said first and second points of operating potential having a relatively large value for programming an element to one of said two conditions;

means applying a control voltage to the control electrodes of said first and second transistors having a value intermediate the voltages at said first and second points for turning on said first transistor and coupling via its conduction path the potential at said first point to said output terminal and for concurrently turning on said second transistor for causing a predetermined portion of the potential at said output terminal to be developed across the conduction path of said second transistor and the remainder of said output voltage across the conduction path of said third transistor.

* * * * *

UNITED STATES PATENT AND TRADEMARK OFFICE
CERTIFICATE OF CORRECTION

PATENT NO. : 4,317,110

DATED : February 23, 1982

INVENTOR(S): Sheng T. Hsu

It is certified that error appears in the above-identified patent and that said Letters Patent is hereby corrected as shown below:

Col. 4, lines 19-20 change "mak-ing" to --- makes ---.

Col. 5, line 24 change "$\overline{X1}$" to --- X1 ---.

line 25 change "$\overline{X2}$" to --- X2 ---.

line 25 change "X1 and X2" to --- $\overline{X1}$ and $\overline{X2}$ ---.

Col. 6, line 2 change "Zi" to --- $\overline{Zi}$ ---.

line 39 change "inveter" to --- inverter ---.

Col. 9, line 37 change "Z" to --- $\overline{Z}$ ---.

line 43 change "Zi" to --- $\overline{Zi}$ ---.

Signed and Sealed this

Thirteenth Day of July 1982

[SEAL]

Attest:

Attesting Officer

GERALD J. MOSSINGHOFF

Commissioner of Patents and Trademarks